United States Patent
Soejima

(10) Patent No.: US 10,215,819 B2
(45) Date of Patent: Feb. 26, 2019

(54) MAGNETIC RESONANCE IMAGING APPARATUS AND WIRELESS RF COIL APPARATUS

(71) Applicant: Toshiba Medical Systems Corporation, Otawara-shi (JP)

(72) Inventor: Kazuyuki Soejima, Nasushiobara (JP)

(73) Assignee: Toshiba Medical Systems Corporation, Otawara-shi (JP)

(*) Notice: Subject to any disclaimer, the term of this patent is extended or adjusted under 35 U.S.C. 154(b) by 374 days.

(21) Appl. No.: 15/230,905

(22) Filed: Aug. 8, 2016

(65) Prior Publication Data

US 2017/0082706 A1 Mar. 23, 2017

(30) Foreign Application Priority Data

Sep. 17, 2015 (JP) .................. 2015-184306

(51) Int. Cl.
| | | |
|---|---|---|
| G01V 3/00 | (2006.01) | |
| G01R 33/36 | (2006.01) | |
| H04W 56/00 | (2009.01) | |
| H04L 7/00 | (2006.01) | |
| H04W 4/70 | (2018.01) | |

(Continued)

(52) U.S. Cl.
CPC ....... *G01R 33/3692* (2013.01); *G01R 33/307* (2013.01); *G01R 33/34* (2013.01); *G01R 33/36* (2013.01); *G01R 33/3607* (2013.01); *G01R 33/3614* (2013.01); *G01R 33/3621* (2013.01); *G01R 33/3628* (2013.01);
(Continued)

(58) Field of Classification Search
CPC ...... G01R 33/307; G01R 33/34; G01R 33/36; G01R 33/3607; G01R 33/3614; G01R 33/3621; G01R 33/3628; G01R 33/3635; G01R 33/3642; G01R 33/365; G01R 33/3657; G01R 33/3664; G01R 33/3671; G01R 33/3678; G01R 33/3685
USPC .................................................. 324/300–322
See application file for complete search history.

(56) References Cited

U.S. PATENT DOCUMENTS

| | | | | |
|---|---|---|---|---|
| 2009/0310712 | A1* | 12/2009 | Nakatani ................. | H03L 7/099 375/316 |
| 2010/0117649 | A1* | 5/2010 | Nakanishi .......... | G01R 33/3692 324/318 |

(Continued)

FOREIGN PATENT DOCUMENTS

| | | |
|---|---|---|
| JP | 2014-50712 | 3/2014 |
| JP | 2014-140469 | 8/2014 |

*Primary Examiner* — Giovanni Astacio-Oquendo
*Assistant Examiner* — Raul Rios Russo
(74) *Attorney, Agent, or Firm* — Oblon, McClelland, Maier & Neustadt, L.L.P.

(57) ABSTRACT

A wireless RF coil unit according to the embodiment includes at least one receiver, a converter, a mixer and a filter. The at least one receiver receive a first analog signal having a first frequency synchronized with a first clock of a device different from the coil unit, and a second analog signal having a second frequency different from the first frequency. The converter converts the first analog signal into a first digital signal, and the second analog signal into a second digital signal, in accordance with a second clock of the coil unit. The mixer generates a multiplication signal of the first digital signal and the second digital signal. The filter passes a predetermined frequency component in the multiplication signal and outputs an intermediated frequency signal.

12 Claims, 6 Drawing Sheets

(51) Int. Cl.
*G01R 33/34* (2006.01)
*G01R 33/30* (2006.01)

(52) U.S. Cl.
CPC ............ *H04L 7/0012* (2013.01); *H04W 4/70* (2018.02); *H04W 56/0015* (2013.01)

(56) References Cited

U.S. PATENT DOCUMENTS

| | | | |
|---|---|---|---|
| 2011/0124301 A1* | 5/2011 | Prasidh | G01R 33/3692 455/110 |
| 2014/0062480 A1 | 3/2014 | Bollenbeck et al. | |
| 2014/0218035 A1 | 8/2014 | Okamoto | |

* cited by examiner

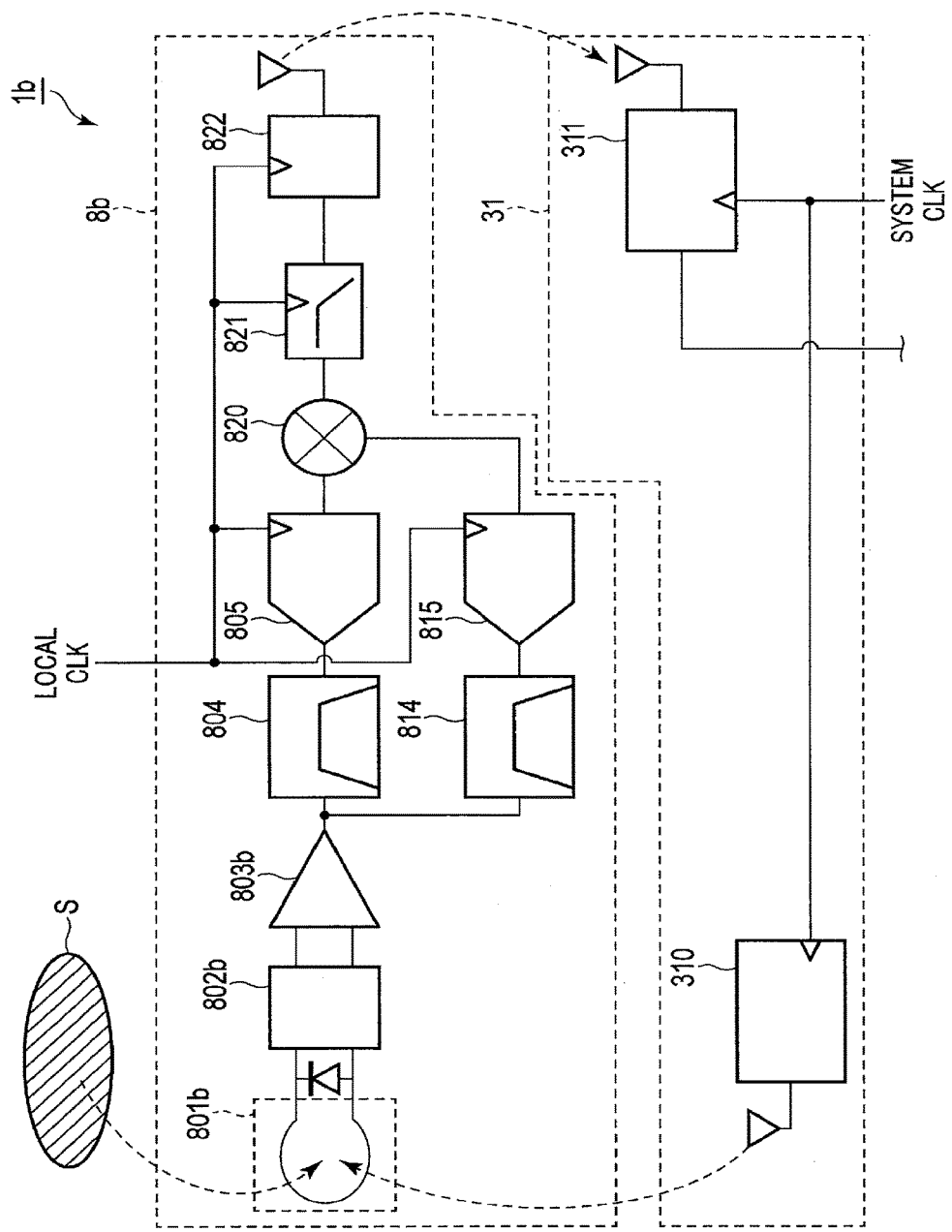
F I G. 5

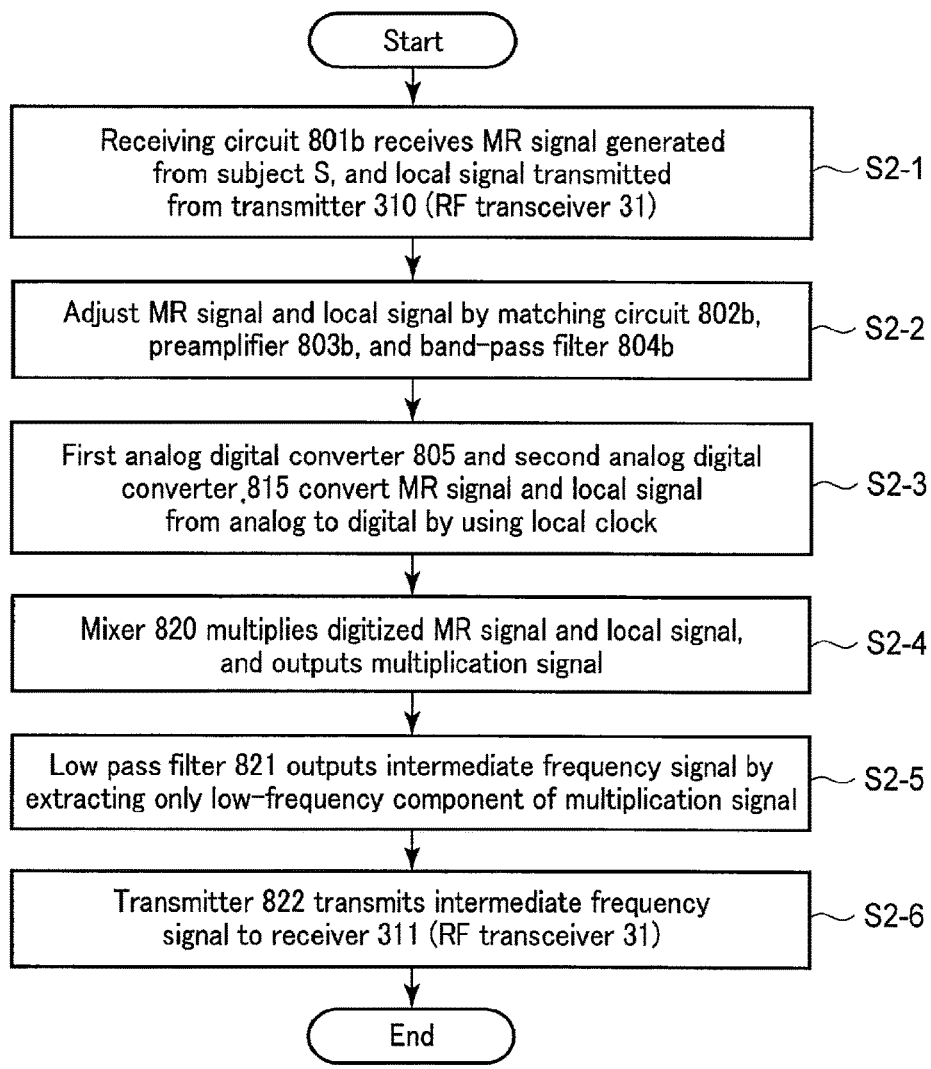
F I G. 6

MAGNETIC RESONANCE IMAGING APPARATUS AND WIRELESS RF COIL APPARATUS

CROSS-REFERENCE TO RELATED APPLICATIONS

This application is based upon and claims the benefit of priority from the prior Japanese Patent Application No. 2015-184306, filed Sep. 17, 2015 the entire contents of which are incorporated herein by reference.

FIELD

Embodiments described herein relate generally to a magnetic resonance imaging apparatus and wireless RF coil apparatus.

BACKGROUND

An MRI (Magnetic Resonance Imaging) apparatus is widely used in the field of medical image diagnosis. MRI is an imaging method based on a magnetic resonance phenomenon. In this imaging method, an atomic nucleus (e.g., $^1H$) spin of an subject placed in astatic magnetic field is magnetically excited by an RF (Radio Frequency) signal having a Larmor frequency, and an MRI image is reconstructed from an MR (Magnetic Resonance) signal generated by the excitation.

When performing magnetic resonance imaging, a local RF coil unit is sometimes used to receive an MR signal generated from a subject.

In the magnetic resonance imaging apparatus, a multichannel MR signal acquisition system is often used in recent years. More specifically, a multichannel MR signal is often used from a coil element of the RF coil unit to an RF transceiver of the magnetic resonance imaging apparatus main body. As a consequence, the number of connection cables between the two units increases by the multichannel configuration, and wiring becomes complicated. Therefore, it is expected to eliminate this inconvenience by using wireless communication between the RF coil unit and magnetic resonance imaging apparatus main body, i.e., between the RF coil unit and RF transceiver.

When implementing a wireless RF coil unit, the clock of the wireless RF coil unit is sometimes asynchronous to the clock of the apparatus main body. To reduce the asynchrony of a signal to be converted by analog-digital conversion in accordance with the clock of the wireless RF coil unit, it is possible to strictly synchronize the clock of the wireless RF coil unit to that of the apparatus main body, but this method is not easy.

BRIEF DESCRIPTION OF THE DRAWING

FIG. 5 is a block diagram showing the arrangement of an RF transceiver and wireless RF coil unit in a magnetic resonance imaging apparatus according to the second embodiment;

FIG. 6 is a flowchart showing an operation example of the magnetic resonance imaging apparatus according to the second embodiment.

DETAILED DESCRIPTION

In general, according to one embodiment, a magnetic resonance imaging apparatus includes a wireless RF coil unit. The wireless RF coil unit includes at least one receiver configured to receive a first analog signal having a first frequency synchronized with a first clock of a device different from the wireless RF coil unit, and a second analog signal having a second frequency different from the first frequency, a converter configured to convert the first analog signal into a first digital signal, and the second analog signal into a second digital signal, in accordance with a second clock of the wireless RF coil unit, a mixer configured to generate a multiplication signal of the first digital signal and the second digital signal, and a filter configured to pass a predetermined frequency component in the multiplication signal and output an intermediated frequency signal.

Embodiments will be explained below with reference to the accompanying drawings.

First Embodiment

Figure 1:
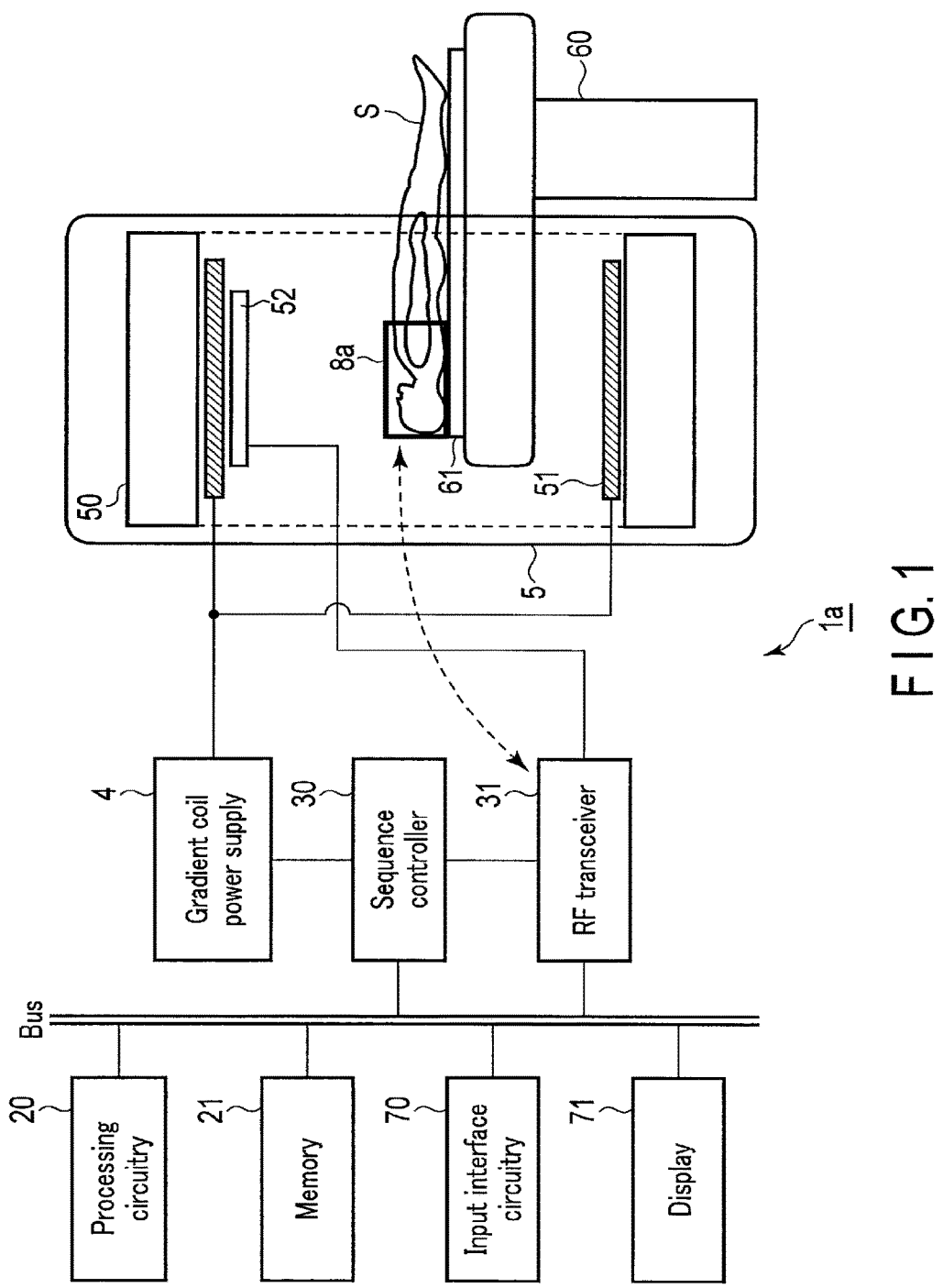
FIG. 1 is a block diagram showing a magnetic resonance imaging apparatus according to the first embodiment.

FIG. 1 is a block diagram showing an example of a magnetic resonance imaging apparatus 1a according to the first embodiment.

The magnetic resonance imaging apparatus 1a according to the first embodiment includes a processing circuitry 20, memory 21, sequence controller 30, RF transceiver 31, gradient coil power supply 4, gantry 5, bed 60, input interface circuitry 70, and display 71.

The processing circuitry 20 process and control an overall operation related to the magnetic resonance imaging apparatus 1a according to the first embodiment. The processing circuitry 20 is, e.g., a CPU (Central Processing Unit) (not shown). The processing circuitry 20 implement functions of magnetic resonance imaging, e.g., data acquisition function and image reconstruction function, by reading out predetermined programs stored in the memory 21.

Note that a plurality of processing circuits 20 may also be used in one-to-one correspondence with the functions. Alternatively, these two arrangements can be combined.

The memory 21 store, e.g., a protocol of magnetic resonance imaging, a plurality of parameters contained in the protocol, combinations of the values of these parameters (imaging conditions), examination information on a subject S, an MRI image, and various programs. The examination information contains, e.g., the examination date/time, the patient number (ID), the distinction of sex, the name, the date of birth, the height, the weight, an examination portion, an insertion direction, a posture, a receiving coil to be used (a wireless RF coil unit 8a), the attachment position of the receiving coil, the presence/absence and the type of biological signal synchronization, and the presence/absence and the type of contrast medium. Examples of the programs are programs for implementing the data acquisition function, image reconstruction function, and the like by the processing circuitry 20. Note that the memory 21 may also store another information.

The memory 21 is implemented as a storage device such as an HDD (Hard Disk Drive) or SSD (Solid State Drive). The memory 21 may also include a memory such as a RAM (Random Access Memory) for storing temporarily necessary information (e.g., an argument or array) for an arithmetic operation of a program.

The sequence controller 30 is connected to the RF transceiver 31 and gradient coil power supply 4. The sequence controller 30 controls a sequence for transmission of an electrical signal for generating a gradient magnetic field, and transmission/reception of an electrical signal for generating an RF pulse. That is, the sequence controller 30 transmits a trigger to each connection destination at a predetermined timing.

The RF transceiver 31 supplies an electrical signal (transmission driving signal) for generating an RF pulse from an RF transmitting coil 52 of the gantry 5, to the RF transmitting coil 52 via an amplification circuit (not shown). Also, the RF transceiver 31 wirelessly receives an MR signal received by the wireless RF coil unit 8a of the gantry 5.

Furthermore, the RF transceiver 31 wirelessly transmits a local signal to be used to down-convert the MR signal, to the wireless RF coil unit 8a at a predetermined timing. These contents will be explained in detail later with reference to FIG. 2 and the like.

In response to the trigger from the sequence controller 30, the gradient coil power supply 4 supplies an electric current to a gradient coil 51 included in the gantry 5.

The gantry 5 includes a static field magnet 50, the gradient coil 51, and the RF transmitting coil 52.

The static field magnet 50 has an almost cylindrical hollow shape, and generates a static magnetic field inside the almost cylindrical shape. A space region having a particularly high uniformity in the generated magnetic field is used in imaging. In the magnetic resonance imaging apparatus 1a, the static field magnet 50 is a superconducting magnet. However, the static field magnet 50 is not limited to a superconducting magnet, and may also be a permanent magnet or normal conduction magnet.

The gradient coil 51 is attached inside the static field magnet 50. The gradient coil 51 is a coil unit formed into an almost cylindrical hollow shape. The gradient coil 51 generates a desired gradient magnetic field in response to an input electric power (electrical signal) from an amplification circuit (not shown) included in the gradient coil power supply 4. The application of this gradient magnetic field causes atomic nuclei in the subject S to have different Larmor frequencies corresponding to the positions of these atomic nuclei. This Larmor frequency difference makes it possible to distinguish between the slice positions based on the MR signals.

Note that although not shown for the sake of simplicity, the gradient coil 51 is actually formed by combining three coils corresponding to the X-, Y-, and Z-axes perpendicular to each other. These three coils form gradient magnetic fields which change the magnetic field strengths along the X-, Y-, and Z-axes.

The formed gradient magnetic fields of the X-, Y-, and Z-axes form, e.g., a slice selective gradient magnetic field Gs, phase encoding gradient magnetic field Ge, and readout gradient magnetic field Gr. The slice selective gradient magnetic field Gs is used to determine an arbitrary imaging section. The phase encoding gradient magnetic field Ge is used to change the phase of a magnetic resonance signal in accordance with a spatial position. The readout gradient magnetic field Gr is used to change the frequency of a magnetic resonance signal in accordance with a spatial position.

The RF transmitting coil 52 transmits an RF pulse to the subject S in response to the transmission driving signal supplied from the RF transceiver 31. The RF pulse excites an atomic nucleus of the subject S, which corresponds to a unique Larmor frequency.

The bed 60 includes a table top 61 on which the subject S is placed. The table top 61 is driven by, e.g., an electromagnetic motor (not shown), and horizontally moves in the longitudinal direction of the bed 60. Note that the bed 60 need not always be fixed in an imaging room. For example, it is also possible to use the bed 60 (a dockable bed) which is detachable and movable with respect to the gantry 5. In this case, the bed 60 includes casters (not shown). By using these casters, an operator such as a doctor can move the bed 60. It is also possible to supply power to these casters by using, e.g., electromagnetic motors (not shown), and move the bed 60 or assist (power assist) the movement of the bed 60 by using the power.

The input interface circuitry 70 accept an instruction of an operator such as a doctor via a user interface such as a switch button, mouse, or keyboard. This instruction is transferred to the processing circuitry 20. In accordance with the instruction, the processing circuitry 20 executes predetermined control or a predetermined arithmetic operation.

The display 71 displays a GUI (Graphical User Interface) screen. The display 71 is implemented as, e.g., a CRT display, liquid crystal display, organic EL display, or plasma display. In response to predetermined control by the processing circuitry 20, the display 71 displays, e.g., a magnetic resonance imaging image (MRI image) stored in the memory 21 on the GUI screen. Alternatively, the magnetic resonance imaging apparatus 1a according to the first embodiment may appropriately use a printer (not shown) capable of printing the display screen of the display 71.

Note that the magnetic resonance imaging apparatus 1a according to the first embodiment may also include a read/write unit (not shown) for reading out information from a recording medium and writing information on the recording medium. The recording medium can be any medium as long as it is a removable medium. For example, when the recording medium is an optical medium (e.g., CD: Compact Disc or DVD: Digital Versatile Disc), the read/write unit is implemented as an optical drive. When the recording medium is a magneto optical medium (MO disk: Magneto Optical disc), the read/write unit is implemented as a magneto optical drive. The read/write unit can move or copy an MRI image stored in the memory 21 to the recording medium. The read/write unit can also move or copy an MRI image recorded on the recording medium to the memory 21.

The wireless RF coil unit 8a is attached to, e.g., a desired position of the subject S placed on the table top 61. The wireless RF coil unit 8a may also be installed near the subject S placed on the table top 61. The wireless RF coil unit 8a receives an MR signal generated when an atomic nucleus of the subject S returns from an excited state to an original state, and wirelessly transmits the received MR signal to the RF transceiver 31. Details of the wireless RF coil unit 8a will be described later with reference to FIG. 2.

After that, when the RF transceiver 31 has received the MR signal, the processing circuitry 20 reads out a program of the data acquisition function from the memory 21, thereby storing the MR signal in the memory 21. In addition, the processing circuitry 20 reads out a predetermined program of the image reconstruction function, thereby performing an arithmetic operation of inverse Fourier transform on the MR signal stored in the memory 21, and generating an MRI image from the MR signal.

Note that the magnetic resonance imaging apparatus 1a according to the first embodiment may include a data acquisition circuit for executing the data acquisition function and/or an image reconstruction circuit for executing the image reconstruction function, separated from the processing circuitry 20. Note also that the magnetic resonance imaging apparatus 1a according to the first embodiment may include a dedicated circuit for executing the data acquisition function and image reconstruction function.

Figure 2:
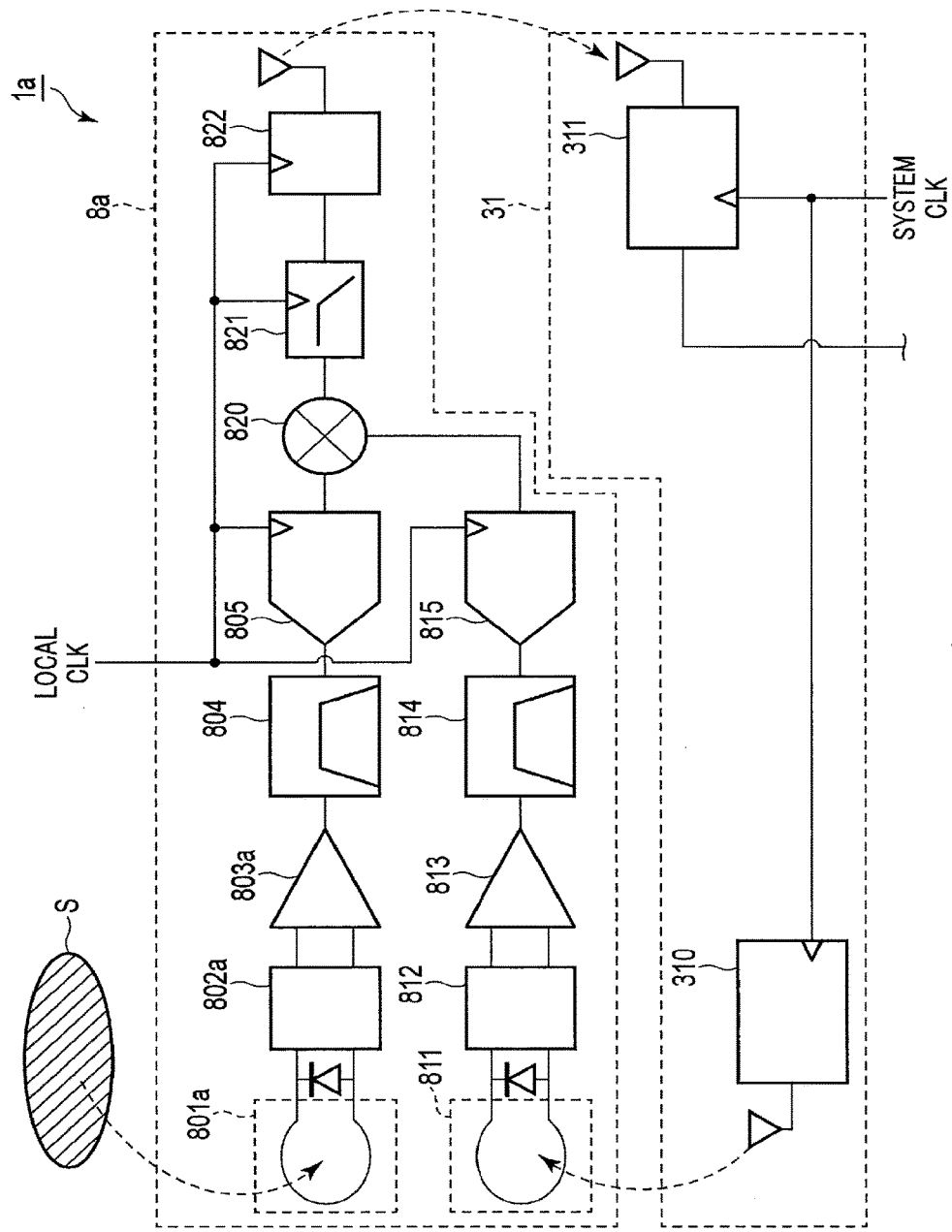
FIG. 2 is a block diagram showing the arrangement of an RF transceiver and wireless RF coil unit in the magnetic resonance imaging apparatus according to the first embodiment.

FIG. 2 is a block diagram showing the arrangement of the RF transceiver 31 and wireless RF coil unit 8a of the magnetic resonance imaging apparatus 1a according to the first embodiment.

The wireless RF coil unit 8a includes a first receiving coil 801a, first matching circuit 802a, first preamplifier 803a, first band-pass filter 804, first analog-digital converter (ADC) 805, second receiving coil 811, second matching circuit 812, second preamplifier 813, second band-pass filter 814, second analog-digital converter 815, mixer (multiplier) 820, low pass filter 821, and transmitter 822.

The first receiving coil 801a is an RF coil element that receives an MR signal generated by the subject S. Assume that this MR signal has a frequency $f_M$ (a first frequency) synchronized with a system clock (SYSTEM CLK in FIG. 2). A clock is a binary signal which periodically takes a high-voltage state and low-voltage state, and is used to, e.g., synchronize a plurality of digital circuits. The system clock is a clock to be used when performing a digital arithmetic operation between the RF transceiver 31 and each constituent device of the magnetic resonance imaging apparatus 1a according to the first embodiment, which is wiredly connected to the RF transceiver 31. A clock generator (not shown) generates and transmits the system clock. For example, this clock generator can be included in the processing circuitry 20, and can also be a circuit separated from the processing circuitry 20.

The first matching circuit 802a is a circuit for matching the output impedance and input impedance.

The first preamplifier 803a amplifies an MR signal having in-vivo information of the subject S.

The first band-pass filter 804 passes only a necessary frequency component of the MR signal having the in-vivo information of the subject S, and attenuates frequency components other than this component.

The first analog-digital converter 805 converts the MR signal having the in-vivo information of the subject S into a digital signal in accordance with a local clock (LOCAL CLK in FIG. 2) which is not synchronized with the system clock. The local clock is a clock to be used when performing a digital arithmetic operation in the wireless RF coil unit 8a. A clock generator (not shown) generates and transmits the local clock. This clock generator is included in the wireless RF coil unit 8a.

More specifically, the first analog-digital converter 805 converts the MR signal as a continuous signal into a discrete signal digitized by a predetermined sampling frequency. A digitized MR signal $AD_M$ is expressed by (1) equation described below.

$$AD_M = \cos\{2\pi(f_M + \Delta f)t + (\Phi_M + \Delta\Phi)\} \quad (1)$$

t is the time, and $\Phi_M$ is the initial phase of the MR signal. Since the first analog-digital converter 805 uses the local clock which is not synchronized with the system clock, the MR signal $AD_M$ corresponding to the frequency $f_M$ synchronized with the system clock has a frequency shift component $\Delta f$ and phase shift component $\Delta\Phi$.

The second receiving coil 811 is an RF coil element that receives a local signal transmitted from the transmitter 310 included in the RF transceiver 31. This local signal has a frequency $f_L$ synchronized with the system clock.

The second matching circuit 812 matches the output impedance and input impedance.

The second preamplifier 813 amplifies the local signal.

The second band-pass filter 814 passes only a necessary frequency component of the local signal, and attenuates frequency components other than this component.

The second analog-digital converter 815 converts the local signal into a digital signal by using the local clock. That is, the second analog-digital converter 815 converts the local signal as a continuous signal into a discrete signal digitized by a predetermined sampling frequency. A digitized local signal $AD_L$ is expressed by (2) equation described below.

$$AD_L = \cos\{2\pi(f_L + \Delta f)t + (\Phi_L + \Delta\Phi)\} \quad (2)$$

t is the time, and $\Phi_L$ is the initial phase of the local signal. Since the second analog-digital converter 815 uses the local clock which is not synchronized with the system clock, the local signal $AD_L$ corresponding to the frequency $f_L$ synchronized with the system clock has the frequency shift component $\Delta f$ and phase shift component $\Delta\Phi$.

The mixer 820 executes a multiply operation on the two inputs, and outputs the operation result. More specifically, the mixer 820 multiplies the digitized MR signal $AD_M$ and digitized local signal $AD_L$, and outputs a multiplication signal MS. The multiplication signal MS is expressed by (3) equation described below.

$$\begin{aligned} MS &= AD_M \times AD_L \\ &= \cos\{2\pi(f_M + \Delta f)t + (\Phi_M + \Delta\Phi)\} \times \\ &\quad \cos\{2\pi(f_L + \Delta f)t + (\Phi_L + \Delta\Phi)\} \\ &= \frac{1}{2}\left[\begin{array}{l}\cos\{2\pi(f_M + \Delta f + f_L + \Delta f)t + (\Phi_M + \Delta\Phi + \Phi_L + \Delta\Phi)\} + \\ \cos\{2\pi(f_M + \Delta f - f_L - \Delta f)t + (\Phi_M + \Delta\Phi - \Phi_L - \Delta\Phi)\}\end{array}\right] \\ &= \frac{1}{2}\left[\begin{array}{c}\cos\{2\pi(f_M + f_L + 2\Delta f)t + (\Phi_M + \Phi_L + 2\Delta\Phi)\} + \\ \cos\{2\pi(f_M - f_L)t + (\Phi_M - \Phi_L)\}\end{array}\right] \end{aligned} \quad (3)$$

The low pass filter 821 is a digital frequency filter which passes frequency components contained in the input signal and lower than a predetermined frequency, and attenuates frequency components higher than the predetermined frequency component. More specifically, the low pass filter 821 attenuates a component (a high-frequency component: frequency $(f_M+f_L)$) of the first term in equation (3). In other words, the low pass filter 821 outputs an intermediated frequency signal IF by passing only a component (a low-frequency component: frequency $|f_M-f_L|$) of the second term in equation (3). The intermediated frequency signal is expressed by (4) equation described below.

$$IF = \left(\frac{1}{2}\right)\cos\{2\pi(f_M - f_L)t + (\Phi_M - \Phi_L)\} \quad (4)$$

Note that an arbitrary digital filter such as a finite impulse response filter or infinite impulse response filter may also be used as the low pass filter 821.

As indicated by equation (4), the low pass filter 821 cancels the frequency shift component Δf and phase shift component AΦ contained in the MR signal $AD_M$, local signal $AD_L$, and multiplication signal MS. That is, the intermediated signal IF practically has neither a frequency shift component nor a phase shift component.

The transmitter 822 converts the intermediated frequency signal IF into a wirelessly communicable frequency, and transmits the frequency. This wireless communication is preferably performed by using the transmitter 822 having a transmission capacity corresponding to a data volume to be acquired. Before wireless transmission, the intermediated frequency signal IF may also be down-converted into a baseband.

The RF transceiver 31 includes a transmitter 310 and receiver 311.

The transmitter 310 transmits the RF pulse to be used in the local signal. Note that in the magnetic resonance imaging apparatus 1a, the RF transmitting coil 52 may also transmit the RF pulse to be used as the local signal, instead of the transmitter 310.

The receiver 311 receives the intermediated frequency signal transmitted from the transmitter 322. The received intermediated frequency signal is acquired as k-space data, and an MRI image showing the interior of the subject S is generated based on the acquired k-space data.

Note that this embodiment is implemented by using one wireless RF coil unit 8a and one RF transceiver 31 in FIG. 2, but the embodiment may also be implemented by using a plurality of wireless RF coil units 8a and a plurality of RF transceivers 31. Furthermore, it is also possible to implement the embodiment by using a plurality of wireless RF coil units 8a and one RF transceiver 31.

[Operation Example]

Figure 3:
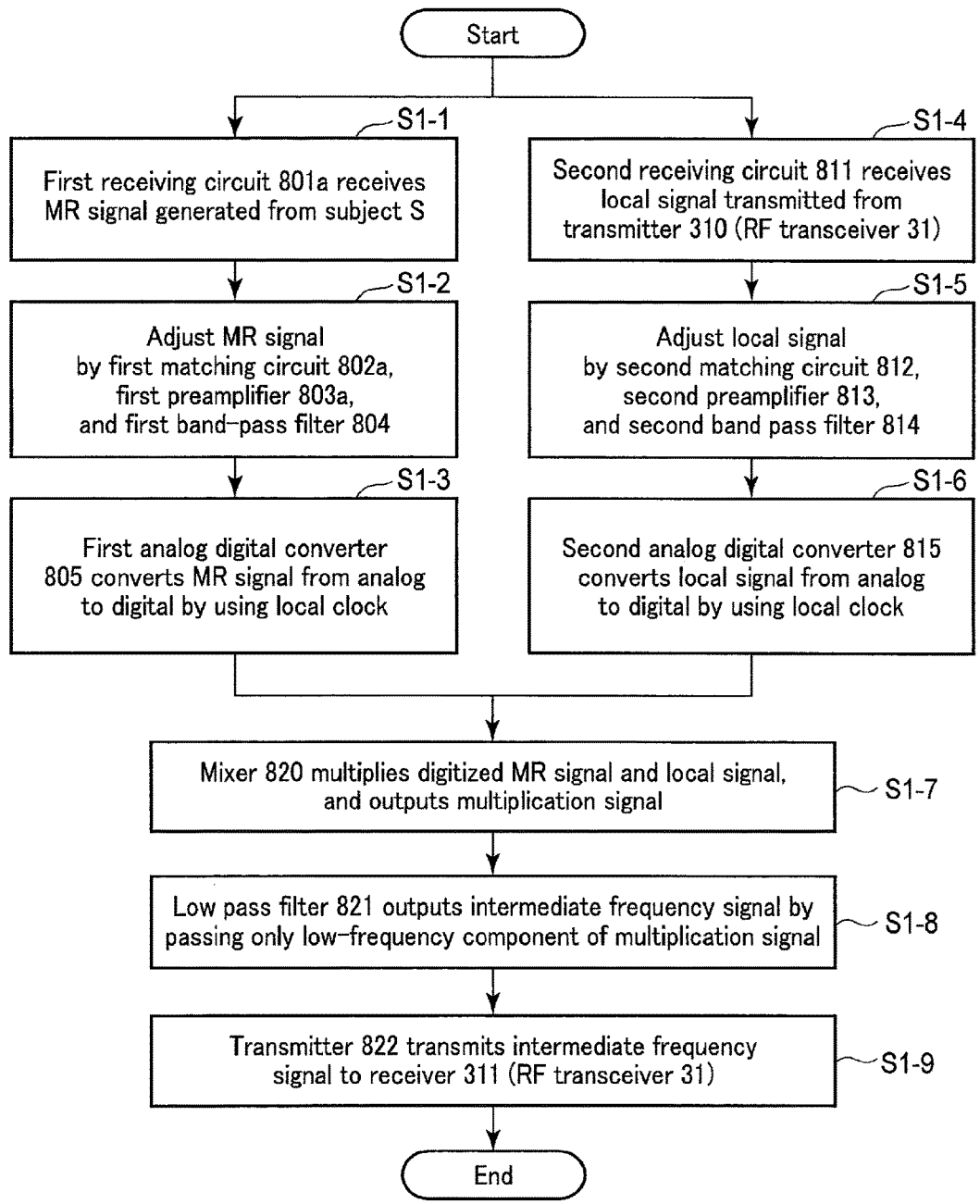
FIG. 3 is a flowchart showing an operation example of the magnetic resonance imaging apparatus according to the first embodiment.

FIG. 3 is a flowchart showing an operation example of the wireless RF coil unit 8a of the magnetic resonance imaging apparatus 1a according to the first embodiment. The operation of the wireless RF coil unit 8a of the magnetic resonance imaging apparatus 1a according to the first embodiment will be explained below following the individual steps shown in FIG. 3.

Steps S1-1, S1-2, and S1-3 are the steps of an MR signal receiving process.

(Step S1-1)

As described above, the RF transceiver 31 generates a transmission driving signal having a predetermined transmission frequency, and transmits the generated transmission driving signal to the RF transmitting coil 52. The RF transceiver 31 operates in accordance with an operation frequency synchronized with the system clock. In response to the transmission driving signal, the RF transmitting coil 52 transmits an RF pulse. Since the RF pulse is transmitted to the subject S, an atomic nucleus of the subject S, which corresponds to a unique Larmor frequency, is excited. Also, an MR signal is generated when the atomic nucleus of the subject S returns from the excited state to the original state. The first receiving coil 801a receives the generated MR signal. The frequency of the MR signal almost matches that of the transmission driving signal. That is, the MR signal has a frequency synchronized with the system clock. For example, when the transmission driving signal has 64 MHz, the MR signal has 64 MHz as the frequency of the system clock. Note that the frequency of the transmission driving signal and MR signal is not limited to 64 MHz, and may also be any frequency.

(Step S1-2)

The first matching circuit 802a, first preamplifier 803a, and first band-pass filter 804 adjust the MR signal having in-vivo information of the subject S. More specifically, the first matching circuit 802a matches the output impedance and input impedance. This impedance matching can reduce, e.g., a loss caused by impedance mismatching on the MR signal from the first receiving coil 801a to the first preamplifier 803a. The first preamplifier 803a amplifies the MR signal supplied via the first matching circuit 802a. The first band-pass filter 804 passes only a necessary frequency component of the MR signal from the first preamplifier 803a, and attenuates frequency components other than this component.

(Step S1-3)

The first analog-digital converter 805 converts the MR signal from the first band-pass filter 804 from analog to digital in accordance with the local clock, and outputs the digitized MR signal. In this step, the first analog-digital converter 805 executes sampling by using the local clock. Since sampling is executed in accordance with the local clock different from the system clock, the digitized MR signal output from the first analog-digital converter 805 shifts the frequency from the frequency synchronized with the system clock, i.e., the frequency of the MR signal received by the first receiving coil 801a. This shift of the frequency will be called a frequency shift hereinafter. For example, the frequency of the digitized MR signal is 64.00001 MHz shifted by 0.00001 MHz from the frequency of the MR signal received by the first receiving coil 801a.

Steps S1-4, S1-5, and S1-6 are the steps of a local signal receiving process.

(Step S1-4)

The second receiving coil 811 receives a local signal transmitted by the transmitter 310. More specifically, the local signal is an RF pulse generated by the transmitter 310 based on the system clock, and having almost the same frequency as the system clock frequency. The local signal has, e.g., 62 MHz. However, this is merely an example, and the present invention is not limited to this. Note that in order to receive the local signal and MR signal in parallel, the local signal transmission timing of the RF transceiver 31 is preferably predetermined as one sequence.

(Step S1-5)

The second matching circuit 812, second preamplifier 813, and second band-pass filter 814 adjust the local signal to be used in down-conversion. More specifically, the second matching circuit 812 matches the output impedance and input impedance. This impedance matching can reduce, e.g., a loss caused by impedance mismatching on the MR signal from the second receiving coil 811 to the second preamplifier 813. The second preamplifier 813 amplifies the local signal supplied via the second matching circuit 812. The second band-pass filter 814 passes only a necessary frequency component of the local signal from the second preamplifier 813, and attenuates frequency components other than this component.

(Step S1-6)

The second analog-digital converter 815 converts the local signal from analog to digital in accordance with the local clock, and outputs the digitized local signal. In this step, the second analog-digital converter 815 executes sampling by using the local clock from the second band-pass filter 814. Since sampling is executed in accordance with the local clock different from the system clock, the digitized local signal output from the second analog-digital converter 815 shifts the frequency from the frequency synchronized with the system clock, i.e., the frequency of the local signal received by the second receiving coil 811. Note that since both the first and second analog-digital converters 805 and 815 operate in accordance with the local clock, the digitized MR signal and digitized local signal have almost the same frequency shift component. For example, the frequency of the digitized local signal is 62.00001 MHz shifted by 0.00001 MHz from the frequency of the local signal received by the second receiving coil 811. (Step S1-7)

The mixer 820 outputs a multiplication signal of the digitized MR signal and digitized local signal.
(Step S1-8)

The low pass filter 821 outputs an intermediated frequency signal by passing only a low-frequency component of the multiplication signal. The intermediated frequency signal has a frequency synchronized with the local clock. For example, when the MR signal has a frequency of 64.00001 MHz and the local signal has a frequency of 62.00001 MHz as described above, the intermediated frequency signal has a frequency of 2 MHz. Since the intermediated frequency signal is generated by applying the low pass filter to the multiplication signal, the intermediated frequency signal has neither a frequency shift nor a phase shift mixed in a high-frequency component.
(Step S1-9)

The transmitter 822 converts the intermediated frequency signal into a wirelessly transmittable frequency, and transmits the converted signal. The receiver 311 receives the intermediated frequency signal transmitted by the transmitter 822. This intermediated frequency signal is wirelessly transmitted to the RF transceiver 31, and converted into a baseband signal by being down-converted into the baseband, e.g., 0 Hz by a frequency converter. After that, the processing circuitry 20 performs, e.g., image reconstruction based on the baseband signal in accordance with the system clock. The intermediated frequency signal according to this embodiment has neither a frequency shift component nor a phase shift component caused by asynchrony between the system clock and local clock, and hence can accurately be converted into the baseband compared to a signal having these shift components. Accordingly, the processing circuitry 20 according to this embodiment can reduce signal noise or an image artifact caused by a shift from the baseband.

Note that in the above embodiment, the wireless RF coil unit 8a transmits the intermediated frequency signal to the RF transceiver 31. However, this embodiment is not limited to this. To omit down-conversion by the RF transceiver 31 after wireless transmission, the wireless RF coil unit 8a may also output the baseband signal by using the mixer 820 and a low pass filter or the like.

In the above embodiment, the wireless RF coil unit 8a includes the mixer 820 and low pass filter 821. However, this embodiment is not limited to this. A magnetic resonance imaging apparatus according to a modification will be explained below. Note that in the following explanation, the same reference numerals denote constituent elements having almost the same functions as in this embodiment, and a repetitive explanation will be made only when necessary.

Figure 4:
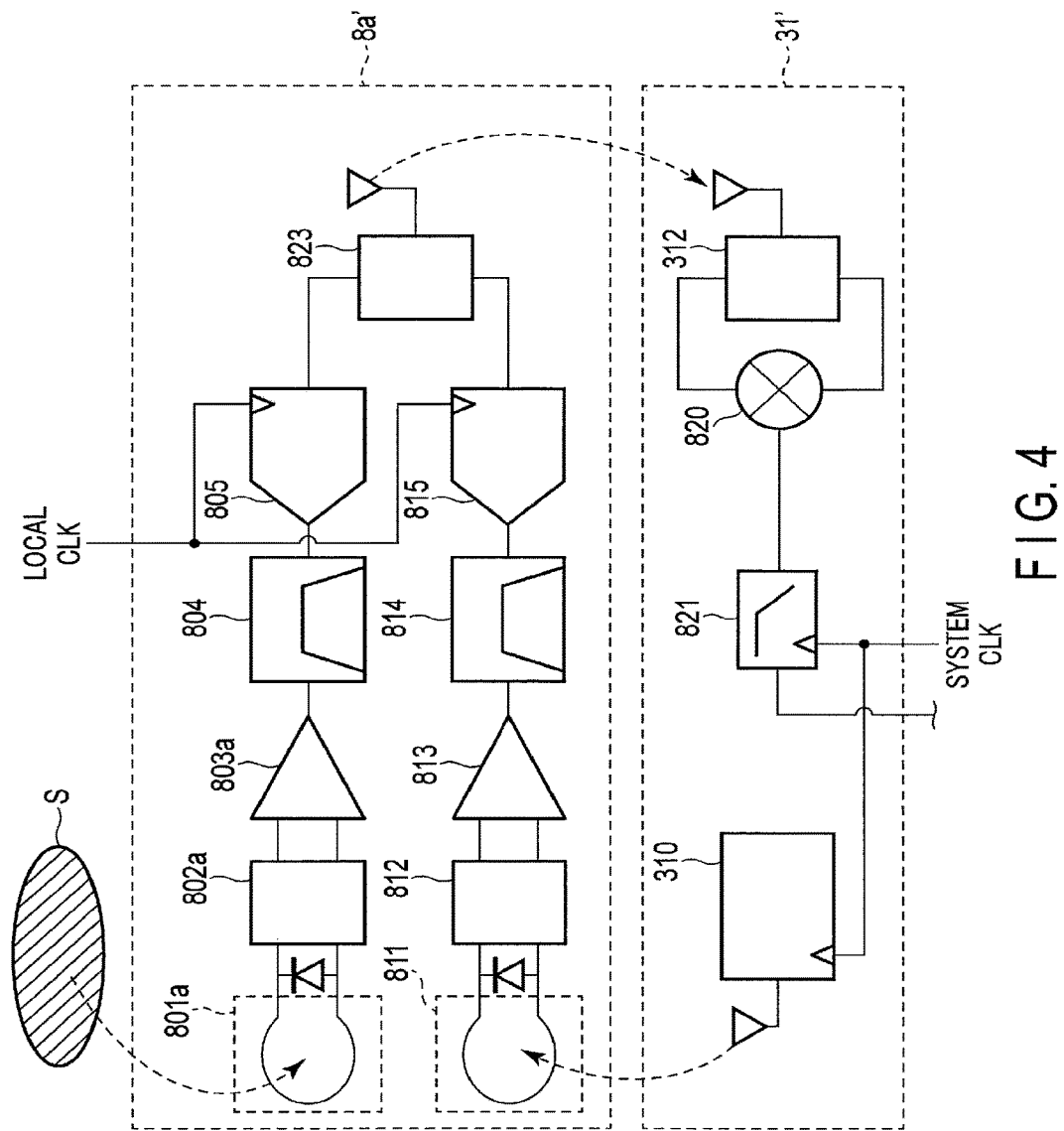
FIG. 4 is a block diagram showing the arrangement of an RF transceiver and wireless RF coil unit in a magnetic resonance imaging apparatus according to a modification of the first embodiment.

FIG. 4 is a block diagram showing the arrangement of an RF transceiver 31' and wireless RF coil unit 8a' of the magnetic resonance imaging apparatus according to the modification. As shown in FIG. 4, the wireless RF coil unit 8a' includes a first receiving coil 801a, first matching circuit 802a, first preamplifier 803a, first band-pass filter 804, first analog-digital converter 805, second receiving coil 811, second matching circuit 812, second preamplifier 813, second band-pass filter 814, second analog-digital converter 815, and encoder 823. Thus, the wireless RF coil unit 8a' according to the modification does not include the mixer 820 and low pass filter 821.

The encoder 823 encodes a digitized MR signal from the first analog-digital converter 805 and a digitized local signal from the second analog-digital converter 815, and generates a serial signal in which the MR signal and local signal are arrayed in series.

The RF transceiver 31' includes a transmitter 310, decoder 312, mixer 820, and low pass filter 821.

The decoder 312 decodes the serial signal from the wireless RF coil unit 8a', thereby dividing the signal into the digitized MR signal and digitized local signal. The mixer 820 generates a multiplication signal of the divided MR signal and local signal, and the low pass filter 821 generates an intermediated frequency signal from the multiplication signal.

In the magnetic resonance imaging apparatus 1a according to the modification as described above, the mixer 820 and low pass filter 821 are incorporated into the RF transceiver 31', instead of the wireless RF coil unit 8a'. This arrangement can reduce the number of parts of the wireless RF coil unit 8a' compared to that of the wireless RF coil unit 8a.

The magnetic resonance imaging apparatus 1a according to the first embodiment achieves the following effects.

The magnetic resonance imaging apparatus 1a according to the first embodiment includes the wireless RF coil unit 8a. The wireless RF coil unit 8a includes the receiving coils 801a and 811, analog-digital converters 805 and 815, mixer 820, and low pass filter 821. The receiving coils 801a and 811 receive the analog signal (MR signal) having the frequency $f_M$ synchronized with the system clock, and the analog signal (local signal) having the frequency $f_L$. The analog-digital converters 805 and 815 convert the MR signal into the digitized MR signal $AD_M$, and the local signal into the digitized local signal $AD_L$, in accordance with the local clock. The mixer 820 generates a multiplication signal of the digitized MR signal $AD_M$ and digitized local signal $AD_L$. The low pass filter 821 generates the intermediated frequency signal IF having a differential frequency between the frequencies $f_M$ and $f_L$ by applying a frequency filter for passing a frequency component lower than a predetermined frequency to the multiplication signal.

As described above, the receiving coils 801a and 811 receive the local signal for reducing the frequency shift component Δf and phase shift component ΔΦ, in parallel to the MR signal. The local signal is transmitted from the transmitter 310 to the receiving coils 801a and 811 at a predetermined timing when acquiring the MR signal. The frequencies of the local signal and MR signal are synchronized with the system clock generated by the magnetic resonance imaging apparatus main body. The analog-digital converters 805 and 815 generate the digitized MR signal $AD_M$ and digitized local signal $AD_L$ in accordance with the local clock generated by the wireless RF coil unit 8a. The local clock is not synchronized with the system clock. Therefore, the MR signal $AD_M$ and local signal $AD_L$ have almost the same asynchrony with respect to the system clock. The mixer 820 converts the MR signal $AD_M$ and local signal $AD_L$ into a multiplication signal, and the low pass filter 821 converts the multiplication signal into an intermediated frequency signal. Since the mixer 820 and low pass filter 821 are used, the intermediated frequency signal practically has neither the frequency shift component Δf nor the phase shift component ΔΦ caused by asynchrony between the system clock and local clock. That is, the magnetic resonance imaging apparatus according to this embodiment can reduce the asynchrony of the MR signal (more specifically, the intermediated frequency signal) which undergoes analog-digital conversion in accordance with the local clock which is not synchronized with the system clock.

Note that in the above-described embodiment, the magnetic resonance imaging apparatus 1a includes the low pass filter 821 that passes the difference component between the frequencies $f_M$ and $f_L$ of the multiplication signal MS and outputs the intermediated frequency signal IF having the difference component. However, the embodiment is not limited to this. For example, if the frequency $f_L$ is less than 0, that is, if the frequency $f_L$ is a negative frequency, the absolute value of the difference component of the second term in equation (3) becomes larger than that of the sum component of the first term, and the low pass filter 821 cannot pass the difference component of the second term. For this reason, if the frequency $f_L$ is negative, the magnetic resonance imaging apparatus 1a may use a high pass filter in place of the low pass filter 821. The high pass filter is a digital frequency filter that passes frequency components equal to or higher than a predetermined frequency component included in the input signal, and attenuates frequency components equal to or lower than the predetermined frequency component. More specifically, the high pass filter attenuates the sum component of the first term in equation (3), and passes only the difference component of the second term in equation (3). That is, the high pass filter can output the intermediated frequency signal IF in which the frequency shift component Δf and the phase shift component ΔΦ included in the sum component of the first term in equation (3) are reduced as compared to the multiplication signal. The magnetic resonance imaging apparatus 1a including the high pass filter can reduce the asynchrony of the MR signal (more specifically, the intermediated frequency signal) converted by analog-digital conversion by the local clock which is not synchronized with the system clock, as in a case in which the magnetic resonance imaging apparatus includes the low pass filter 821.

Second Embodiment

FIG. 5 is a block diagram showing the arrangement of an RF transceiver 31 and wireless RF coil unit 8b of a magnetic resonance imaging apparatus 1b according to the second embodiment. In the following explanation, the same reference numerals as in the magnetic resonance imaging apparatus 1a according to the first embodiment denote constituent elements having almost the same arrangements, and a repetitive explanation will be made only when necessary.

The magnetic resonance imaging apparatus 1b according to the second embodiment includes the RF transceiver 31 and wireless RF coil unit 8b.

The wireless RF coil unit 8b includes a receiving coil 801b, matching circuit 802b, preamplifier 803b, first band-pass filter 804, first analog-digital converter 805, second band-pass filter 814, second analog-digital converter 815, mixer 820, low pass filter 821, and transmitter 822.

The receiving coil 801b receives an MR signal generated in a subject S, and an RF pulse which is transmitted from a transmitter 310 included in the RF transceiver 31 and used in a local signal. The MR signal has a frequency $f_M$ synchronized with a system clock (SYSTEM CLK in FIG. 5). The local signal has a frequency $f_L$ synchronized with the system clock.

The matching circuit 802b is a circuit for matching the output impedance and input impedance.

The preamplifier 803b amplifies a received signal containing both the MR signal having in-vivo information of the subject S and the local signal to be used in down-conversion. The amplified received signal is distributed to the first and second band-pass filters 804 and 814. The first band-pass filter 804 passes only a frequency component corresponding to the MR signal, and the second band-pass filter 814 passes only a frequency component corresponding to the local signal. Accordingly, an output signal from the first band-pass filter 804 is a signal corresponding to the MR signal in the received signal which is received by the receiving coil 801b. Also, an output signal from the second band-pass filter 814 is a signal corresponding to the local signal in the received signal which is received by the receiving coil 801b.

[Operation Example]

FIG. 6 is a flowchart showing an operation example of the wireless RF coil unit 8b of the magnetic resonance imaging apparatus 1b according to the second embodiment. The operation of the wireless RF coil unit 8b of the magnetic resonance imaging apparatus 1b according to the second embodiment will be explained below following the individual steps shown in FIG. 6.

(Step S2-1)

When an RF pulse is transmitted to the subject S, an atomic nucleus of the subject S, which corresponds to a unique Larmor frequency, is excited. Also, an MR signal is generated when the atomic nucleus of the subject S returns from the excited state to the original state. The receiving coil 801b receives this MR signal. The MR signal has a frequency synchronized with the system clock, e.g., 64 MHz.

The receiving coil 801b also receives a local signal transmitted from the transmitter 310 of the RF transceiver 31. This local signal has a frequency synchronized with the system clock, e.g., 62 MHz. However, this frequency is merely an example, and the present invention is not limited to this. Note that in order to receive the MR signal generated in the subject S and the local signal at almost the same time, the transmission timing of the local signal to be transmitted from the RF transceiver 31 is preferably predetermined as one sequence.

(Step S2-2)

The matching circuit 802b, preamplifier 803b, and first band-pass filter 804 adjust the MR signal having the in-vivo information of the subject S and the local signal to be used in down-conversion. More specifically, the matching circuit 802b matches the output impedance and input impedance. The preamplifier 803b amplifies the MR signal and local signal. The first band-pass filter 804 passes only a necessary frequency component of the MR signal, and attenuates frequency components other than this component. The second band-pass filter 814 passes only a necessary frequency component of the local signal, and attenuates frequency components other than this component.

(Step S2-3)

The first analog-digital converter 805 converts the MR signal from an analog signal to a digital signal in accordance with the local clock, and outputs the digitized MR signal. In this step, the first analog-digital converter 805 executes sampling in accordance with the local clock. The digitized MR signal output from the first analog-digital converter 805 has a frequency shift component. For example, the frequency of the digitized MR signal is 64.00001 MHz which is shifted by 0.00001 MHz from the frequency of the MR signal received by the receiving coil 801b.

The second analog-digital converter 815 converts the local signal from an analog signal to a digital signal in accordance with the local clock, and outputs the digitized local signal. In this step, the second analog-digital converter 815 executes sampling by using the local clock.

The digitized local signal output from the second analog-digital converter 815 has a frequency shift component. For example, the frequency of the digitized local signal is 62.00001 MHz which is shifted by 0.00001 MHz from the frequency of the local signal received by the receiving coil 801*b*.

(Step S2-4)

The mixer 820 outputs a multiplication signal of the digitized MR signal and digitized local signal.

(Step S2-5)

The low pass filter 821 outputs an intermediated frequency signal by passing only a low-frequency component of the multiplication signal. This intermediated frequency signal has a frequency synchronized with the local clock, e.g., 2 MHz, and has neither a frequency shift nor a phase shift.

(Step S2-6)

The transmitter 822 converts the intermediated frequency signal into a wirelessly transmittable frequency, and transmits the wireless signal. The receiver 311 receives the wireless signal transmitted by the transmitter 822.

Note that in the above embodiment, the wireless RF coil unit 8*b* transmits the intermediated frequency signal to the RF transceiver 31. However, this embodiment is not limited to this. To omit down-conversion by the RF transceiver 31 after wireless transmission, the wireless RF coil unit 8*b* may also output a baseband signal by using the mixer 820 and a low pass filter or the like.

Note also that in the wireless RF coil unit 8*b* of the above embodiment, the signal line is branched into two systems after the preamplifier 803*b*, and the band-pass filters 804 and 814 and analog-digital converters 805 and 815 are installed in these systems. However, this embodiment is not limited to this. In the wireless RF coil unit 8*b*, it is also possible to install an analog-digital converter after the preamplifier 803*b*, branch the signal line into two systems after this analog-digital converter, and install the band-pass filters 804 and 814 in these systems. In this case, the outputs of the band-pass filters 804 and 814 are connected to one mixer 820. In this arrangement, only one analog-digital converter is necessary. This makes it possible to reduce the manufacturing cost and the number of parts of the wireless RF coil unit 8*b*, when compared to the arrangement in which the two analog-digital converters 805 and 815 are used as in the above embodiment.

The magnetic resonance imaging apparatus 1*b* according to the second embodiment achieves the following effects.

The magnetic resonance imaging apparatus 1*b* according to the second embodiment includes the wireless RF coil unit 8*b*. The wireless RF coil unit 8*b* includes the receiving coil 801*b*, analog-digital converters 805 and 815, mixer 820, and low pass filter 821. The receiving coil 801*b* receives an analog signal (the MR signal) having the frequency $f_M$ synchronized with the system clock, and an analog signal (the local signal) having the frequency $f_L$. The analog-digital converters 805 and 815 convert the MR signal into a digitized MR signal $AD_M$ and the local single into a digitized local signal $AD_L$ in accordance with the local clock. The mixer 820 generates a multiplication signal of the digitized MR signal $AD_M$ and digitized local signal $AD_L$. The low pass filter 821 generates an intermediated frequency signal IF having a differential frequency between the frequencies $f_M$ and $f_L$ by applying a frequency filter for passing a frequency component lower than a predetermined frequency to the multiplication signal.

In the above arrangement, the intermediated frequency signal practically has neither the frequency shift component Δf nor the phase shift component ΔΦ caused by asynchrony between the system clock and local clock. That is, this arrangement can reduce the asynchrony of the signal converted by analog-digital conversion by the local clock which is not synchronized with the system clock.

Also, the above arrangement can minimize the number of necessary parts, and implement the wireless RF coil unit 8*b* which is more inexpensive and smaller than the wireless RF coil unit 8*a* of the magnetic resonance imaging apparatus 1*a* according to the first embodiment.

Note that the magnetic resonance imaging apparatus 1*b* according to the second embodiment may be provided with a high pass filter in place of the low pass filter 821, like the magnetic resonance imaging apparatus 1*a* according to the first embodiment.

The components of the magnetic resonance imaging apparatuses 1*a* and 1*b* according to the first and second embodiments can be implemented by properly combining at least a circuit, circuitry, processor, and memory.

The processor means circuits such as a CPU (Central Processing Unit), a GPU (Graphics Processing Unit), an ASIC (Application Specific Integrated Circuit), a programmable logic device (e.g., an SPLD (Simple Programmable Logic Device)), a CLPD (Complex Programmable Logic Device), and an FPGA (Field Programmable Gate Array). The processor implements a function by reading out a program stored in a storage circuit, and executing the program. Note that instead of storing the program in the storage circuit, it is also possible to directly incorporate the program into the circuit of the processor. In this case, the processor implements the function by reading out the program incorporated into the circuit, and executing the program. Note that each processor of this embodiment is not limited to a single circuit, and it is also possible to form one processor by combining a plurality of independent circuits and implement the function of the processor. Furthermore, the function of one processor may also be implemented by integrating a plurality of constituent elements into the processor.

As described previously, the magnetic resonance imaging apparatus 1*a* according to the first embodiment includes the wireless RF coil unit 8*a*. Also, the magnetic resonance imaging apparatus 1*b* according to the second embodiment includes the wireless RF coil unit 8*b*. However, the wireless RF coil unit 8*a* may also be implemented as an independent wireless RF coil device. Likewise, the wireless RF coil unit 8*b* may also be implemented as an independent wireless RF coil device. Even in this case, the wireless RF coil device is so implemented as to cancel the frequency shift component and phase shift component.

In at least one embodiment described above, the intermediated frequency signal practically has neither the frequency shift component nor the phase shift component caused by asynchrony between the system clock and local clock. That is, it is possible to reduce the asynchrony of the signal converted by analog-digital conversion by using the local clock which is not synchronized with the system clock.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising a wireless RF coil unit, the wireless RF coil unit comprising:
at least one receiver configured to receive a first analog signal having a first frequency synchronized with a first clock of a device different from the wireless RF coil unit, and a second analog signal having a second frequency different from the first frequency;
a converter configured to convert the first analog signal into a first digital signal, and the second analog signal into a second digital signal, in accordance with a second clock of the wireless RF coil unit;
a mixer configured to generate a multiplication signal of the first digital signal and the second digital signal; and
a filter configured to pass a predetermined frequency component in the multiplication signal and output an intermediated frequency signal.

2. The apparatus according to claim 1, wherein the filter passes the predetermined frequency component in the multiplication signal to output the intermediated frequency signal having a reduced frequency shift component and a reduced phase shift component, the frequency shift component and the phase shift component being contained in the first digital signal and the second digital signal and caused by asynchrony between the first clock and the second clock.

3. The apparatus according to claim 1, wherein the mixer outputs the intermediated frequency signal having a differential frequency between the first frequency and the second frequency.

4. The apparatus according to claim 1, wherein the receiver is an RF coil element.

5. The apparatus according to claim 1, wherein the first frequency is a frequency of a magnetic resonance signal, and
the second frequency is a frequency different from the frequency of the magnetic resonance signal.

6. The apparatus according to claim 1, wherein the first analog signal is a magnetic resonance signal, and
the second analog signal is the first clock to be used in the device wirelessly connected to the wireless RF coil unit.

7. The apparatus according to claim 1, wherein the at least one receiver includes a first receiver configured to receive the first analog signal, and a second receiver configured to receive the second analog signal.

8. The apparatus according to claim 1, further comprising a transmitter configured to transmit the second analog signal at a predetermined timing, in order to cause the receiver to receive the second analog signal.

9. The apparatus according to claim 1, further comprising the device, wherein
the device processes the intermediated frequency signal in accordance with the first clock.

10. The apparatus according to claim 1, further comprising the device and a transmitter, wherein
the device generates a transmission driving signal having the first frequency synchronized with the first clock,
the transmitter transmits an RF pulse in response to the transmission driving signal, and
the receiver receives the first analog signal generated from an atomic nucleus in an subject, which is excited by the RF pulse.

11. A magnetic resonance imaging apparatus comprising:
a wireless RF coil unit comprising at least one receiver configured to receive a first analog signal having a first frequency synchronized with an external first clock, and a second analog signal having a second frequency different from the first frequency, and
a converter configured to convert the first analog signal into a first digital signal, and the second analog signal into a second digital signal, in accordance with an internal second clock;
a mixer configured to generate a multiplication signal of the first digital signal and the second digital signal; and
a filter configured to pass a predetermined frequency component in the multiplication signal and output an intermediated frequency signal.

12. A wireless RF coil apparatus comprising:
at least one receiver configured to receive a first analog signal having a first frequency synchronized with an external first clock, and a second analog signal having a second frequency different from the first frequency;
a converter configured to convert the first analog signal into a first digital signal, and the second analog signal into a second digital signal, in accordance with an internal second clock;
a mixer configured to generate a multiplication signal of the first digital signal and the second digital signal; and
a filter configured to pass a predetermined frequency component in the multiplication signal and output an intermediated frequency signal.

* * * * *